United States Patent
Zhao (10) Patent No.: US 10,115,347 B2
(45) Date of Patent: Oct. 30, 2018

(54) SCAN DRIVING CIRCUIT AND FLAT DISPLAY DEVICE WITH CIRCUIT

(71) Applicant: Wuhan China Star Optoelectronics Technology Co., Ltd., Wuhan, Hubei (CN)

(72) Inventor: Mang Zhao, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 148 days.

(21) Appl. No.: 15/112,257

(22) PCT Filed: Jun. 23, 2016

(86) PCT No.: PCT/CN2016/086811
§ 371 (c)(1),
(2) Date: Jul. 18, 2016

(87) PCT Pub. No.: WO2017/201787
PCT Pub. Date: Nov. 30, 2017

(65) Prior Publication Data
US 2018/0108300 A1    Apr. 19, 2018

(30) Foreign Application Priority Data

May 27, 2016   (CN) .......................... 2016 1 0361919

(51) Int. Cl.
G09G 3/32      (2016.01)
G09G 3/3266    (2016.01)
G09G 3/36      (2006.01)

(52) U.S. Cl.
CPC ......... G09G 3/3266 (2013.01); G09G 3/3674 (2013.01); *G09G 2310/0283* (2013.01)

(58) Field of Classification Search
CPC .......................... G09G 3/3266; G09G 3/3674
See application file for complete search history.

(56) References Cited

U.S. PATENT DOCUMENTS 5,894,296 A * 4/1999 Maekawa ............ G09G 3/3688
                                                345/100
2008/0143264 A1   6/2008 Minami et al.
(Continued)

FOREIGN PATENT DOCUMENTS

| CN | 103413531 A | 11/2013 |
| CN | 105355179 A | 2/2016 |
| CN | 105427821 A | 3/2016 |

*Primary Examiner* — Kevin M Nguyen
(74) *Attorney, Agent, or Firm* — Andrew C. Cheng (57) ABSTRACT

The disclosure provides a scan driving circuit and a flat display device, the scan driving circuit includes a plurality of cascaded scan driving units, each of the scan driving units includes a forward/backward scanning circuit, applied to receive and process a superior level transmitted signal and a first inferior level transmitted signal, so as to control the scan driving circuit to scan forward and backward; an input circuit charges a pull-up control signal point and a pull-down control signal point according to the superior level transmitted signal and the first inferior level transmitted signal; a latch circuit latches the superior level transmitted signal and the first inferior level transmitted signal; a reset circuit clears and resets electric potential of the pull-up control signal point; a signal multiplexing circuit processes a same level transmitted signal, a second inferior level transmitted signal and latch data.

7 Claims, 6 Drawing Sheets

(56) References Cited

U.S. PATENT DOCUMENTS

2015/0228354 A1 8/2015 Qing et al.
2015/0339998 A1* 11/2015 Yen .................... G09G 3/3674
                                                  345/100

* cited by examiner

SCAN DRIVING CIRCUIT AND FLAT DISPLAY DEVICE WITH CIRCUIT

FIELD OF THE DISCLOSURE

The disclosure relates to a display technical field, and more particularly to a scan driving circuit and a flat display device with the circuit.

BACKGROUND OF THE DISCLOSURE

A conventional flat display device is equipped with a scan driving circuit, which is fabricating the scan driving circuit on an array substrate by a conventional thin film transistor flat display array process, in order to achieve a driving method of scanning line by line. Each scan driving circuit in the conventional flat display device merely drives one scanning line, but multiple scanning lines are disposed in the flat display device, which will need multiple scan driving circuits and complicate design of the circuit, occupying space that can be adverse to a narrow bezel design of the flat display device.

SUMMARY OF THE DISCLOSURE

The technical issue that the disclosure solves is to provide a scan driving circuit and a flat display device with the circuit, in order to simplify the circuit of the flat display device, spare space for a narrow bezel design of the flat display device.

To solve the technical problem above, a proposal of the disclosure is: providing a scan driving circuit, the scan driving circuit includes a plurality of cascaded scan driving units, each of the scan driving units includes: a forward/backward scanning circuit, applied to receive and process a superior level transmitted signal and a first inferior level transmitted signal, so as to control the scan driving circuit to scan forward and backward; an input circuit, connected to the forward/backward scanning circuit, applied to receive the superior level transmitted signal and the first inferior level transmitted signal from the forward/backward scanning circuit, and charge a pull-up control signal point and a pull-down control signal point according to the superior level transmitted signal and the first inferior level transmitted signal; a latch circuit, connected to the input circuit, applied to receive and latch the superior level transmitted signal and the first inferior level transmitted signal from the input circuit; a reset circuit, connected to the input circuit and the latch circuit, applied to clear and reset electric potential of the pull-up control signal point; and a signal multiplexing circuit, connected to the latch circuit, applied to process a same level transmitted signal, a second inferior level transmitted signal and latch data received from the latch circuit, generating a scan driving signal that is exported to a scanning line for driving a pixel unit; the forward/backward scanning circuit includes a first, a second, a third and a fourth controllable switches, a control terminal of the first controllable switch receives the superior level transmitted signal and is connected to a control terminal of the fourth controllable switch, a first terminal of the first controllable switch is connected to a cut-in voltage terminal and a first terminal of the second controllable switch, a second terminal of the first controllable switch is connected to a second terminal of the second controllable switch, a first terminal of the third controllable switch and the input circuit, a control terminal of the second controllable switch receives the first inferior level transmitted signal and is connected to a control terminal of the third controllable switch, a second terminal of the third controllable switch is connected to a first terminal of the fourth controllable switch, a second terminal of the fourth controllable switch is connected to a cut-off voltage terminal; the first and second controllable switches are P type MOS thin film transistors, the control terminals, the first terminals and the second terminals of the first and second controllable switches correspond to gate electrodes, drain electrodes and source electrodes of the P type MOS thin film transistors respectively; the third and fourth controllable switches are N type MOS thin film transistors, the control terminals, the first terminals and the second terminals of the third and fourth controllable switches correspond to gate electrodes, drain electrodes and source electrodes of the N type MOS thin film transistors respectively; the input circuit includes a first inverter and a first clock control inverter, an input terminal of the first inverter receives a clock signal, an output terminal of the first inverter is connected to a first control terminal of the first clock control inverter, a second control terminal of the first clock control inverter receives the clock signal, an input terminal of the first clock control inverter is connected to the second terminal of the first controllable switch, an output terminal of the first clock control inverter is connected to the latch circuit and the reset circuit.

To solve the technical problem above, another proposal of the disclosure is: providing a scan driving circuit, the scan driving circuit includes a plurality of cascaded scan driving units, each of the scan driving units includes: a forward/backward scanning circuit, applied to receive and process a superior level transmitted signal and a first inferior level transmitted signal, so as to control the scan driving circuit to scan forward and backward; an input circuit, connected to the forward/backward scanning circuit, applied to receive the superior level transmitted signal and the first inferior level transmitted signal from the forward/backward scanning circuit, and to charge the a pull-up control signal point and a pull-down control signal point according to the superior level transmitted signal and the first inferior level transmitted signal; a latch circuit, connected to the input circuit, applied to receive and latch the superior level transmitted signal and the first inferior level transmitted signal from the input circuit; a reset circuit, connected to the input circuit and the latch circuit, applied to clear and reset electric potential of the pull-up control signal point; and a signal multiplexing circuit, connected to the latch circuit, applied to process a same level transmitted signal, a second inferior level transmitted signal and latch data received from the latch circuit, generating a scan driving signal that is exported to a scanning line for driving a pixel unit.

The forward/backward scanning circuit includes a first, a second, a third and a fourth controllable switches, a control terminal of the first controllable switch receives the superior level transmitted signal and is connected to a control terminal of the fourth controllable switch, a first terminal of the first controllable switch is connected to a cut-in voltage terminal and a first terminal of the second controllable switch, a second terminal of the first controllable switch is connected to a second terminal of the second controllable switch, a first terminal of the third controllable switch and the input circuit, a control terminal of the second controllable switch receives the first inferior level transmitted signal and is connected to a control terminal of the third controllable switch, a second terminal of the third controllable switch is connected to a first terminal of the fourth controllable switch, a second terminal of the fourth controllable switch is connected to a cut-off voltage terminal.

The first and second controllable switches are P type MOS thin film transistors, the control terminals, the first terminals and the second terminals of the first and second controllable switches correspond to gate electrodes, drain electrodes and source electrodes of the P type MOS thin film transistors respectively; the third and fourth controllable switches are N type MOS thin film transistors, the control terminals, the first terminals and the second terminals of the third and fourth controllable switches correspond to gate electrodes, drain electrodes and source electrodes of the N type MOS thin film transistors respectively.

The input circuit includes a first inverter and a first clock control inverter, an input terminal of the first inverter receives a clock signal, an output terminal of the first inverter is connected to a first control terminal of the first clock control inverter, a second control terminal of the first clock control inverter receives the clock signal, an input terminal of the first clock control inverter is connected to the second terminal of the first controllable switch, an output terminal of the first clock control inverter is connected to the latch circuit and the reset circuit.

The latch circuit includes a second inverter, a third inverter and a second clock control inverter, an input terminal of the second clock control inverter is connected to the output terminal of the first clock control inverter and an input terminal of the third inverter, a first control terminal of the second clock control inverter receives the clock signal, an input terminal of the second inverter receives the clock signal, an output terminal of the second inverter is connected to a second control terminal of the second clock control inverter, an output terminal of the second clock control inverter is connected to an output terminal of the third inverter, the reset circuit and the signal multiplexing circuit.

The reset circuit includes a fifth controllable switch, a control terminal of the fifth controllable switch receives a reset signal, a first terminal of the fifth controllable switch is connected to the input terminal of the second clock control inverter and the input terminal of the third inverter, a second terminal of the fifth controllable switch is connected to the cut-in voltage terminal.

The fifth controllable switch is a P type MOS thin film transistor, the control terminal, the first terminal and the second terminal of the fifth controllable switch correspond to the gate electrode, the drain electrode and the source electrode of the P type MOS thin film transistor respectively.

The signal multiplexing circuit includes a fourth, a fifth, a sixth, a seventh, an eighth, a ninth inverters, a first and a second NAND gates, a first input terminal of the first NAND gate receives a first driving signal, a second input terminal of the first NAND gate is connected to a first input terminal of the second NAND gate and the output terminal of the second clock control inverter, a second input terminal of the second NAND gate receives a second driving signal, an output terminal of the first NAND gate is connected to an input terminal of the fourth inverter, an output terminal of the fourth inverter is connected to an input terminal of the fifth inverter, an input terminal of the sixth inverter is connected to an output terminal of the fifth inverter and receives the same level transmitted signal, an output terminal of the sixth inverter is connected to a same level scanning line, an output terminal of the second NAND gate is connected to an input terminal of the seventh inverter, an output terminal of the seventh inverter is connected to an input terminal of the eighth inverter, an input terminal of the ninth inverter is connected to an output terminal of the eighth inverter and receives the second inferior level transmitted signal, an output terminal of the ninth inverter is connected to an inferior level scanning line.

To solve the technical problem above, another proposal of the disclosure is: providing a flat display device, the flat display device includes a scan driving circuit, the scan driving circuit includes a plurality of cascaded scan driving units, each of the scan driving units includes: a forward/backward scanning circuit, applied to receive and process a superior level transmitted signal and a first inferior level transmitted signal, so as to control the scan driving circuit to scan forward and backward; an input circuit, connected to the forward/backward scanning circuit, applied to receive the superior level transmitted signal and the first inferior level transmitted signal from the forward/backward scanning circuit, and to charge the a pull-up control signal point and a pull-down control signal point according to the superior level transmitted signal and the first inferior level transmitted signal; a latch circuit, connected to the input circuit, applied to receive and latch the superior level transmitted signal and the first inferior level transmitted signal from the input circuit; a reset circuit, connected to the input circuit and the latch circuit, applied to clear and reset electric potential of the pull-up control signal point; and a signal multiplexing circuit, connected to the latch circuit, applied to process a same level transmitted signal, a second inferior level transmitted signal and latch data received from the latch circuit, generating a scan driving signal that is exported to a scanning line for driving a pixel unit.

The forward/backward scanning circuit includes a first, a second, a third and a fourth controllable switches, a control terminal of the first controllable switch receives the superior level transmitted signal and is connected to a control terminal of the fourth controllable switch, a first terminal of the first controllable switch is connected to a cut-in voltage terminal and a first terminal of the second controllable switch, a second terminal of the first controllable switch is connected to a second terminal of the second controllable switch, a first terminal of the third controllable switch and the input circuit, a control terminal of the second controllable switch receives the first inferior level transmitted signal and is connected to a control terminal of the third controllable switch, a second terminal of the third controllable switch is connected to a first terminal of the fourth controllable switch, a second terminal of the fourth controllable switch is connected to a cut-off voltage terminal.

The first and second controllable switches are P type MOS thin film transistors, the control terminals, the first terminals and the second terminals of the first and second controllable switches correspond to gate electrodes, drain electrodes and source electrodes of the P type MOS thin film transistors respectively; the third and fourth controllable switches are N type MOS thin film transistors, the control terminals, the first terminals and the second terminals of the third and fourth controllable switches correspond to gate electrodes, drain electrodes and source electrodes of the N type MOS thin film transistors respectively.

The input circuit includes a first inverter and a first clock control inverter, an input terminal of the first inverter receives a clock signal, an output terminal of the first inverter is connected to a first control terminal of the first clock control inverter, a second control terminal of the first clock control inverter receives the clock signal, an input terminal of the first clock control inverter is connected to the second terminal of the first controllable switch, an output terminal of the first clock control inverter is connected to the latch circuit and the reset circuit.

The latch circuit includes a second inverter, a third inverter and a second clock control inverter, an input terminal of the second clock control inverter is connected to the output terminal of the first clock control inverter and an input terminal of the third inverter, a first control terminal of the second clock control inverter receives the clock signal, an input terminal of the second inverter receives the clock signal, an output terminal of the second inverter is connected to a second control terminal of the second clock control inverter, an output terminal of the second clock control inverter is connected to an output terminal of the third inverter, the reset circuit and the signal multiplexing circuit.

The reset circuit includes a fifth controllable switch, a control terminal of the fifth controllable switch receives a reset signal, a first terminal of the fifth controllable switch is connected to the input terminal of the second clock control inverter and the input terminal of the third inverter, a second terminal of the fifth controllable switch is connected to the cut-in voltage terminal.

The fifth controllable switch is a P type MOS thin film transistor, the control terminal, the first terminal and the second terminal of the fifth controllable switch correspond to the gate electrode, the drain electrode and the source electrode of the P type MOS thin film transistors respectively.

The signal multiplexing circuit includes a fourth, a fifth, a sixth, a seventh, an eighth, a ninth inverters, a first and a second NAND gates, a first input terminal of the first NAND gate receives a first driving signal, a second input terminal of the first NAND gate is connected to a first input terminal of the second NAND gate and the output terminal of the second clock control inverter, a second input terminal of the second NAND gate receives a second driving signal, an output terminal of the first NAND gate is connected to an input terminal of the fourth inverter, an output terminal of the fourth inverter is connected to an input terminal of the fifth inverter, an input terminal of the sixth inverter is connected to an output terminal of the fifth inverter and receives the same level transmitted signal, an output terminal of the sixth inverter is connected to a same level scanning line, an output terminal of the second NAND gate is connected to an input terminal of the seventh inverter, an output terminal of the seventh inverter is connected to an input terminal of the eighth inverter, an input terminal of the ninth inverter is connected to an output terminal of the eighth inverter and receives the second inferior level transmitted signal, an output terminal of the ninth inverter is connected to an inferior level scanning line.

The flat display device is a LCD or an OLED.

Advantageous effects of the disclosure: distinguishing from a conventional technique, the scan driving circuit of the disclosure processes the superior level transmitted signal and the first inferior level transmitted signal by the forward/backward scanning circuit and then controls the scan driving circuit to scan forward and backward, and charges the pull-up control signal point and the pull-down control signal point by the input circuit, latches the superior level transmitted signal and the first inferior level transmitted signal by the latch circuit, finally drives the pixel unit by the scan driving signal generated by the signal multiplexing circuit to export to multiple scanning lines for driving the pixel unit, in order to simplify the circuit of the flat display device, spare space for a narrow bezel design of the flat display device.

DETAILED DESCRIPTION OF PREFERRED EMBODIMENTS

Figure 1:
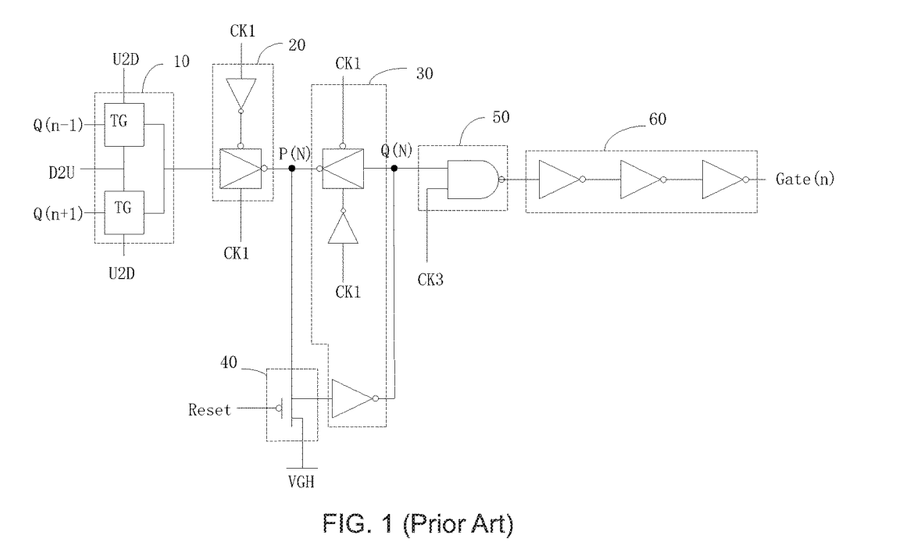
FIG. 1 is a schematic structural view of a conventional scan driving circuit.
Figure 2:
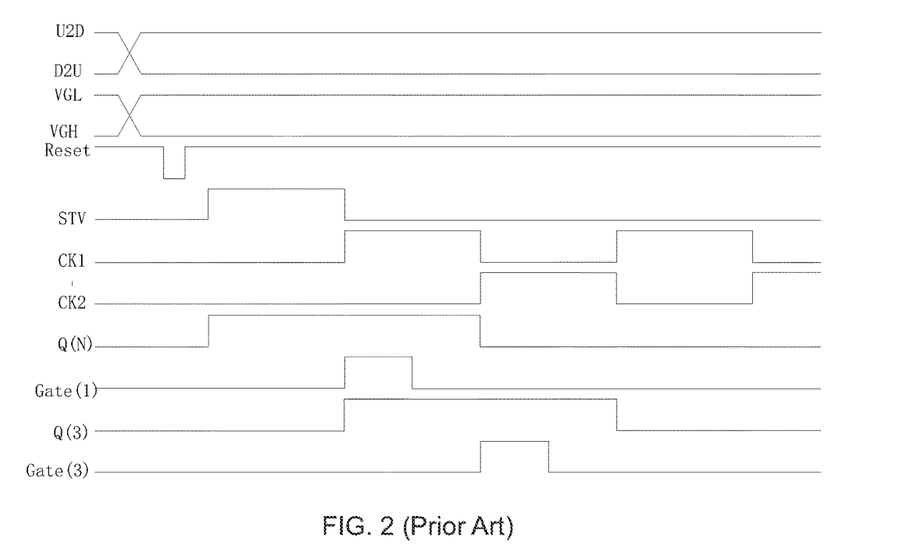
FIG. 2 is an oscillogram of a conventional scan driving circuit.

Referring to FIG. 1, a conventional flat display device has multiple scanning lines, which need a corresponding scan driving circuit, but each conventional driving circuit merely drives one scanning line, each of the scan driving circuit includes a forward/backward scanning circuit 10, an input circuit 20, a latch circuit 30, a reset circuit 40, a signal processing circuit 50 and a driving circuit 60, which will complicate the design of the circuit in a flat display device. Referring to FIG. 2, FIG. 2 is an oscillogram of a conventional scan driving circuit. When a forward scan control voltage U2D is a high level and a backward scan voltage D2U is a low level, an inferior pull-down control signal point Q(n+1) is a high level, the forward/backward scanning circuit 10 outputs a high level signal, when the inferior pull-down control signal point Q(n+1) is a low level, the forward/backward scanning circuit 10 outputs a low level signal, the scan driving circuit is scanning forward; when the forward scan control voltage U2D is a low level and the backward scan voltage D2U is a high level, a superior pull-up control signal point Q(n−1) is a high level, the forward/backward scanning circuit 10 outputs a high level signal, when the superior pull-up control signal point Q(n−1) is a low level, the forward/backward scanning circuit 10 outputs a low level signal, the scan driving circuit is scanning backward. When the forward/backward scanning circuit 10 outputs a high level signal, a first clock signal CK1 outputs a high level signal, the input circuit 20 outputs a low level signal, the low level signal charges a same level pull-up control signal point Q(N) to a high level after going through an inverter in the latch circuit 30, electric potential of the same level pull-up control signal point Q(N) is latched by the latch circuit 30, when a second clock signal CK3 outputs a high level signal, the signal processing circuit 50 outputs a low level signal after NAND operating the high level signal of the same level pull-up control signal point Q(N) and the high level signal of the second clock signal CK3, the low level signal exports a high level scan driving signal to a same level scanning line Gate(n) for providing to a pixel unit after going through an inverter of the driving circuit 60; when the forward/backward scanning circuit 10 outputs a low level signal, a first clock signal CK1 outputs a high level signal, the input circuit 20 outputs a high level signal, the high level signal provides a low level to the same level pull-up control signal point Q(N) after going through the inverter of the latch circuit 30, which means the same level pull-up control signal point Q(N) is discharging, when the second clock signal CK3 outputs a high level signal, the signal processing circuit 50 outputs a high level signal after NAND operating the low level signal of the same level pull-up control signal point Q(N) and the high level signal of the second clock signal CK3, the high level signal exports a low level scan driving signal to the same level scanning line Gate(n) for providing to a pixel after going through an inverter of the driving circuit 60, an operational principle of other scan driving circuit are the same, for which will be skipped.

Figure 3:
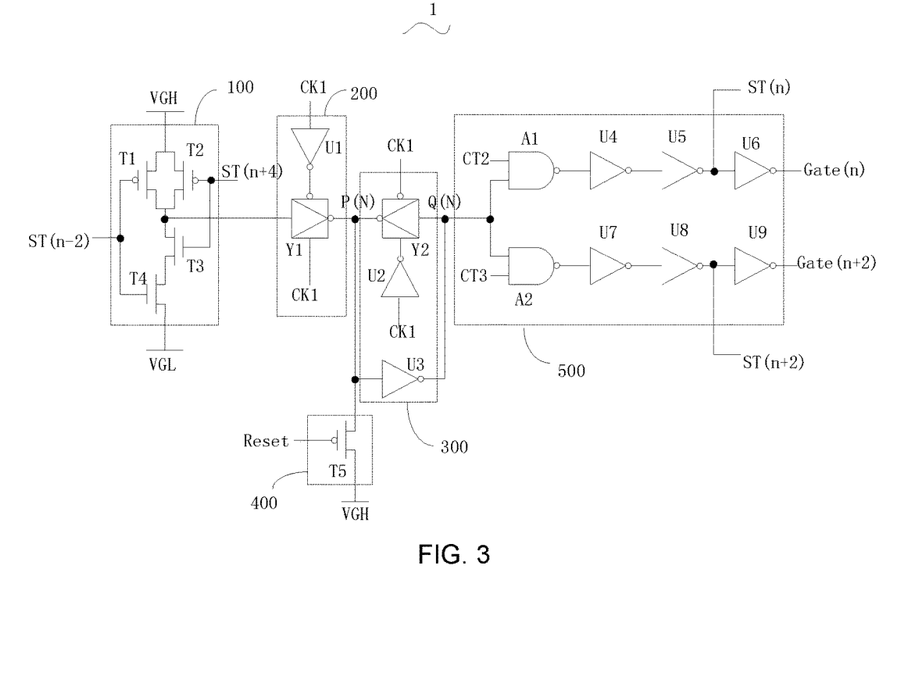
FIG. 3 is a schematic structural view of a scan driving circuit of the disclosure.

Referring to FIG. 3, FIG. 3 is a schematic structural view of a scan driving circuit of the disclosure. In the embodiment, only a scan driving unit 1 is taken as an example. As shown in FIG. 3, the scan driving circuit of the disclosure includes a plurality of cascaded scan driving units 1, each of the scan driving units 1 includes: a forward/backward scanning circuit 100, applied to receive and process a superior level transmitted signal and a first inferior level transmitted signal, so as to control the scan driving circuit to scan forward and backward; an input circuit 200, connected to the forward/backward scanning circuit 100, applied to receive the superior level transmitted signal and the first inferior level transmitted signal from the forward/backward scanning circuit 100, and charge a pull-up control signal point and a pull-down control signal point according to the superior level transmitted signal and the first inferior level transmitted signal; a latch circuit 300, connected to the input circuit 200, applied to receive and latch the superior level transmitted signal and the first inferior level transmitted signal from the input circuit 200; a reset circuit 400, connected to the input circuit 200 and the latch circuit 300, applied to clear and reset electric potential of the pull-up control signal point; and a signal multiplexing circuit 500, connected to the latch circuit 300, applied to process a same level transmitted signal, a second inferior level transmitted signal and latch data received from the latch circuit 300, generating a scan driving signal that is exported to a scanning line for driving a pixel unit.

The forward/backward scanning circuit 100 includes a first to a fourth controllable switches T1-T4, a control terminal of the first controllable switch T1 receives the superior level transmitted signal and is connected to a control terminal of the fourth controllable switch T4, a first terminal of the first controllable switch T1 is connected to a cut-in voltage terminal VGH and a first terminal of the second controllable switch T2, a second terminal of the first controllable switch T1 is connected to a second terminal of the second controllable switch T2, a first terminal of the third controllable switch T3 and the input circuit 200, a control terminal of the second controllable switch T2 receives the first inferior level transmitted signal and is connected to a control terminal of the third controllable switch T3, a second terminal of the third controllable switch T3 is connected to a first terminal of the fourth controllable switch T4, a second terminal of the fourth controllable switch T4 is connected to a cut-off voltage terminal VGL.

The first and second controllable switches T1, T2 are P type MOS thin film transistors, the control terminals, the first terminals and the second terminals of the first and second controllable switches T1, T2 correspond to gate electrodes, drain electrodes and source electrodes of the P type MOS thin film transistors respectively; the third and fourth controllable switches T3, T4 are N type MOS thin film transistors, the control terminals, the first terminals and the second terminals of the third and fourth controllable switches T3, T4 correspond to gate electrodes, drain electrodes and source electrodes of the N type MOS thin film transistors respectively. In other embodiments, the first to the fourth controllable switches T1-T4 can likewise be other types of switches that can achieve the objective of the disclosure, such as the first and second controllable switches T1, T2 are N type MOS thin film transistors, the control terminals, the first terminals and the second terminals of the first and second controllable switches T1, T2 correspond to gate electrodes, drain electrodes and source electrodes of the N type MOS thin film transistors respectively; the third and fourth controllable switches T3, T4 are P type MOS thin film transistors, the control terminals, the first terminals and the second terminals of the third and fourth controllable switches T3, T4 correspond to gate electrodes, drain electrodes and source electrodes of the P type MOS thin film transistors respectively.

The input circuit 200 includes a first inverter U1 and a first clock control inverter Y1, an input terminal of the first inverter U1 receives a clock signal, an output terminal of the first inverter U1 is connected to a first control terminal of the first clock control inverter Y1, a second control terminal of the first clock control inverter Y1 receives the clock signal, an input terminal of the first clock control inverter Y1 is connected to the second terminal of the first controllable switch T1, an output terminal of the first clock control inverter Y1 is connected to the latch circuit 300 and the reset circuit 400.

The latch circuit 300 includes a second inverter U2, a third inverter U3 and a second clock control inverter Y2, an input terminal of the second clock control inverter Y2 is connected to the output terminal of the first clock control inverter Y1 and an input terminal of the third inverter U3, a first control terminal of the second clock control inverter Y2 receives the clock signal, an input terminal of the second inverter U2 receives the clock signal, an output terminal of the second inverter U2 is connected to a second control terminal of the second clock control inverter Y2, an output terminal of the second clock control inverter Y2 is connected to an output terminal of the third inverter U3, the reset circuit 400 and the signal multiplexing circuit 500.

The reset circuit 500 includes a fifth controllable switch T5, a control terminal of the fifth controllable switch T5 receives a reset signal, a first terminal of the fifth controllable switch T5 is connected to the input terminal of the second clock control inverter Y2 and the input terminal of the third inverter U3, a second terminal of the fifth controllable switch T5 is connected to the cut-in voltage terminal VGH.

The fifth controllable switch T5 is a P type MOS thin film transistor, the control terminal, the first terminal and the second terminal of the fifth controllable switch T5 correspond to the gate electrode, the drain electrode and the source electrode of the P type MOS thin film transistor respectively. In other embodiments, the fifth controllable switch T5 can likewise be other types of switches that can achieve the objective of the disclosure, such as the fifth controllable switch T5 is a N type MOS thin film transistor, the control terminal, the first terminal and the second terminal of the fifth controllable switches T5 correspond to a gate electrode, a drain electrode and a source electrode of the N type MOS thin film transistor respectively.

The signal multiplexing circuit 500 includes a fourth to a ninth inverters U4-U9, a first and a second NAND gates A1, A2, a first input terminal of the first NAND gate A1 receives a first driving signal, a second input terminal of the first NAND gate A1 is connected to a first input terminal of the second NAND gate A2 and the output terminal of the second clock control inverter Y2, a second input terminal of the second NAND gate A2 receives a second driving signal, an output terminal of the first NAND gate A1 is connected to an input terminal of the fourth inverter U4, an output terminal of the fourth inverter U4 is connected to an input terminal of the fifth inverter U5, an input terminal of the sixth inverter U6 is connected to an output terminal of the fifth inverter U5 and receives the same level transmitted signal, an output terminal of the sixth inverter U6 is connected to a same level scanning line, an output terminal of the second NAND gate A2 is connected to an input terminal of the seventh inverter U7, an output terminal of the seventh inverter U7 is connected to an input terminal of the eighth inverter U8, an input terminal of the ninth inverter U9 is connected to an output terminal of the eighth inverter U8 and receives the second inferior level transmitted signal, an output terminal of the ninth inverter U9 is connected to an inferior level scanning line.

Figure 4:
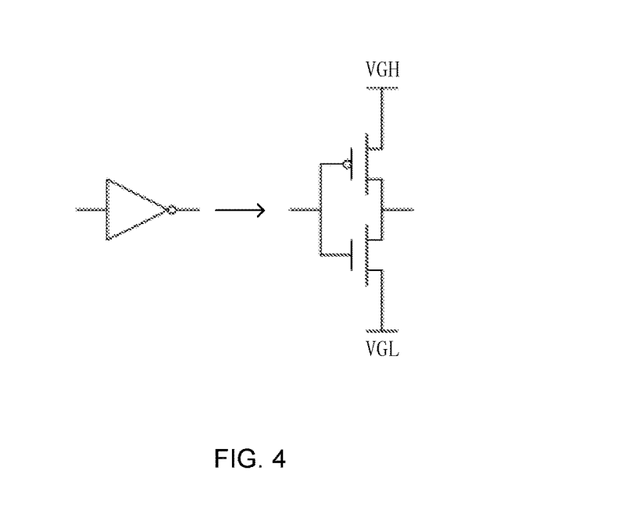
FIG. 4 is a schematic structural view of an inverter in FIG. 3.
Figure 5:
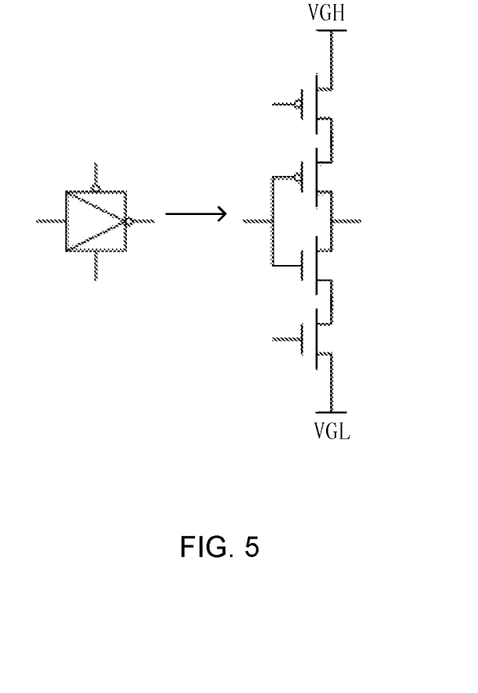
FIG. 5 is a schematic structural view of a clock control inverter in FIG. 3.
Figure 6:
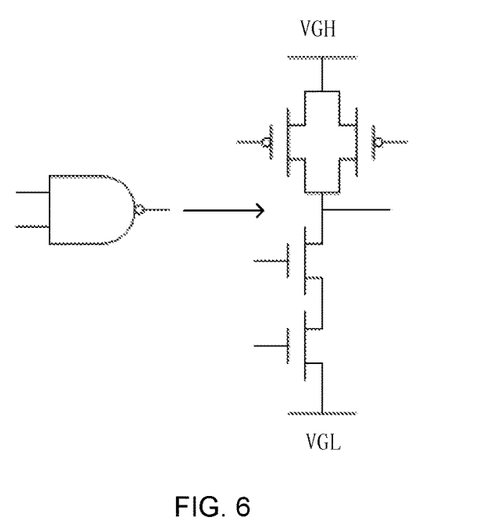
FIG. 6 is a schematic structural view of a NAND in FIG. 3.
Figure 7:
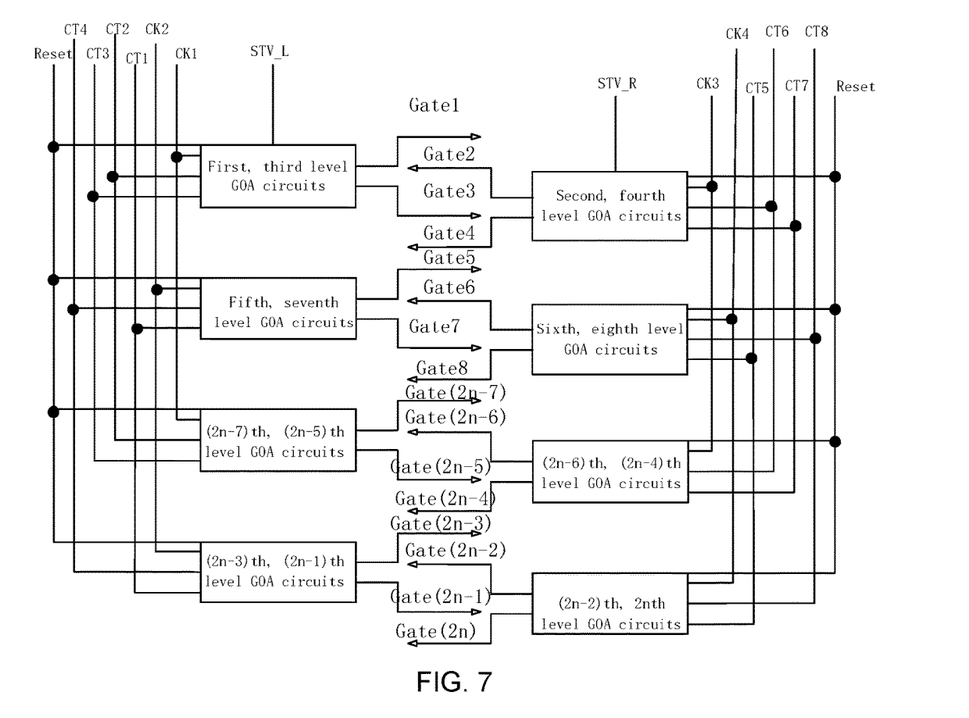
FIG. 7 is a frame diagram of a scan driving circuit of the disclosure.

Referring to FIG. 4 through FIG. 6, which are schematic structural views of the inverter, the clock control inverter and the NAND gate in FIG. 3 respectively, the inverter, the clock control inverter and the NAND gate are all conventional techniques, thereby a detailed description will be skipped here.

In the embodiment, the clock signal is the clock signal CK1, the superior level transmitted signal is a superior level transmitted signal ST(n−2), the first interior level transmitted signal is a first interior level transmitted signal ST(n+4), the same level transmitted signal is a same level transmitted signal ST(n), the second interior level transmitted signal is a second interior level transmitted signal ST(n+2), the reset signal is a reset signal Reset, the pull-up control signal point is the pull-up control signal point Q(N), the pull-down control signal point is a pull-down control signal point P(N), the first driving signal is a first driving signal CT2, the second driving signal is a second driving signal CT3, the same level scanning line is the same level scanning line Gate(n), the interior level scanning line is an interior level scanning line Gate(n+2).

Figure 8:
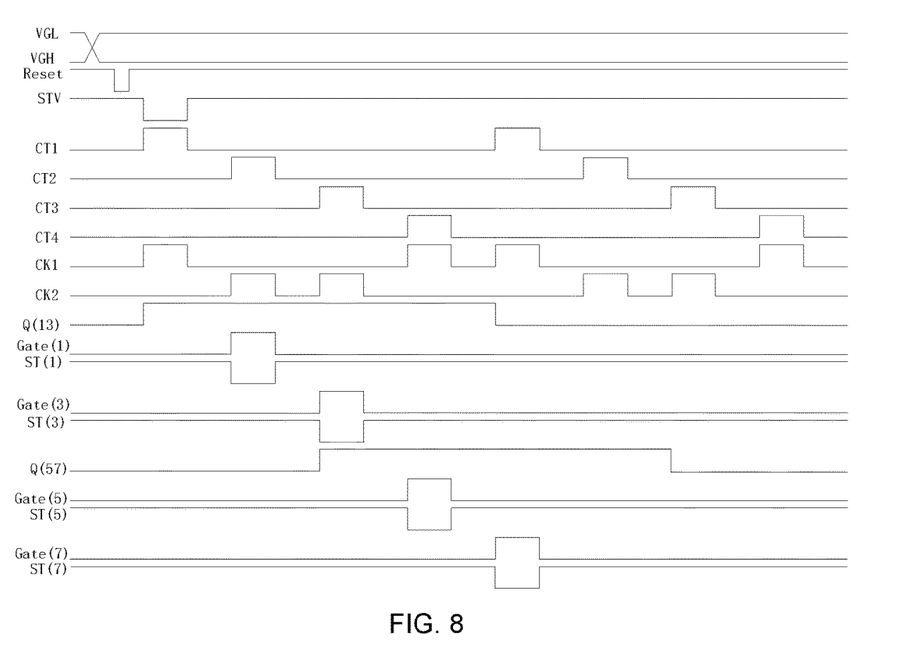
FIG. 8 and FIG. 9 are oscillograms of a scan driving circuit of the disclosure.
Figure 9:
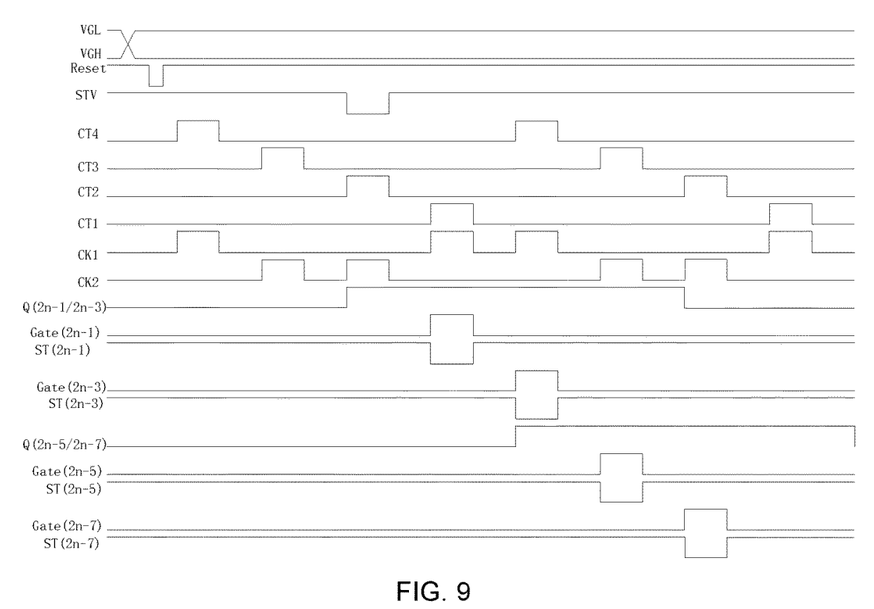

Referring to FIG. 8 and FIG. 9, FIG. 8 and FIG. 9 are oscillograms of a scan driving circuit of the disclosure. An operational principle of the scan driving circuit can be achieved according to FIG. 3 through FIG. 9 as follows: the scan driving unit 1 is taken as an example for illustration. In the forward/backward scanning circuit 100, the superior level transmitted signal ST(n−2) controls the scan driving circuit to scan forward, the first interior level transmitted signal ST(n+4) controls the scan driving circuit to scan backward. When the superior level transmitted signal ST(n−2) and the first interior level transmitted signal ST(n+4) both output high level signals, the forward/backward scanning circuit 100 outputs a low level signal; when the superior level transmitted signal ST(n−2) and the first interior level transmitted signal ST(n+4) both output low level signals, the superior level transmitted signal ST(n−2) outputs a high level signal while the first interior level transmitted signal ST(n+4) outputs a low level signal, or the superior level transmitted signal ST(n−2) outputs a low level signal while the first interior level transmitted signal ST(n+4) outputs a high level signal, the forward/backward scanning circuit 100 outputs a high level signal.

When the forward/backward scanning circuit 100 outputs a high level signal, the clock signal CK1 outputs a high level signal, the input circuit 200 outputs a low level signal, the low level signal exports a high level signal to the pull-up control signal point Q(N) after passing through the third inverter U3, the pull-up control signal point Q(N) is being charged, when the first and the second driving signals CT2, CT3 both output high level signals, the same level transmitted signal ST(n) and the second interior level transmitted signal ST(n+2) both output low level signals, the same level scanning line Gate(n) and the interior level scanning line Gate(n+2) both receive high level scan driving signals for providing to the pixel unit.

When the forward/backward scanning circuit 100 outputs a high level signal, the clock signal CK1 outputs a second high level signal, the input circuit 200 outputs a low level signal, the low level signal exports a high level signal to the pull-up control signal point Q(N) after passing through the third inverter U3, the pull-up control signal point Q(N) retains the high level, when the first and the second driving signals CT2, CT3 both output high level signals, the same level transmitted signal ST(n) and the second interior level transmitted signal ST(n+2) both output low level signals, the same level scanning line Gate(n) and the interior level scanning line Gate(n+2) both receive high level scan driving signals for providing to the pixel unit.

When the forward/backward scanning circuit 100 outputs a low level signal, the clock signal CK1 outputs a high level signal, the input circuit 200 outputs a high level signal, the high level signal exports a low level signal to the pull-up control signal point Q(N) after passing through the third inverter U3, the pull-up control signal point Q(N) is discharging, when the first and the second driving signals CT2, CT3 both output high level signals, the same level transmitted signal ST(n) and the second interior level transmitted signal ST(n+2) both output high level signals, the same level scanning line Gate(n) and the interior level scanning line Gate(n+2) both receive low level scan driving signals for providing to the pixel unit, at this point, the scan driving unit 1 stops. Operational principles of other scan driving units are the same with the above, repeated information will be omitted.

Figure 10:
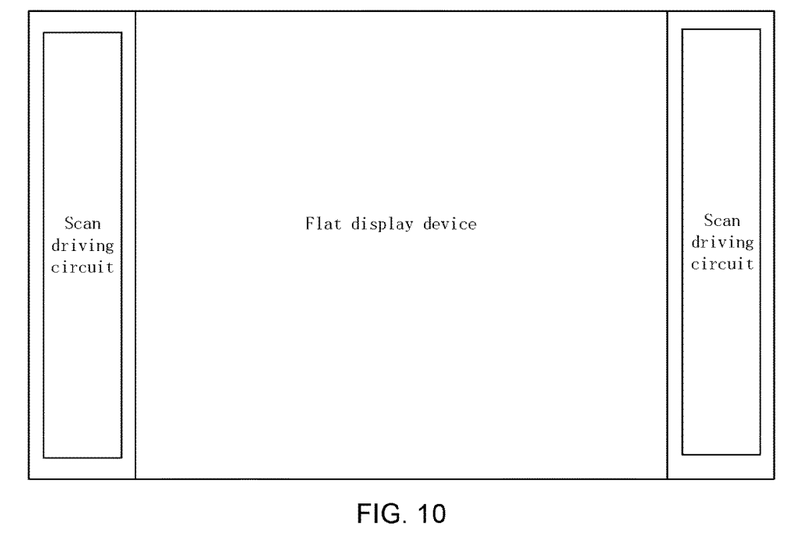
FIG. 10 is a schematic view of a flat display device of the disclosure.

Referring to FIG. 10, FIG. 10 is a schematic view of a flat display device of the disclosure. The flat display device includes the scan driving circuits described previously, the scan driving circuits are disposed on two ends of the flat display device. The flat display device is a LCD or an OLED.

The scan driving circuit of the disclosure processes the superior level transmitted signal and the first inferior level transmitted signal by the forward/backward scanning circuit and then controls the scan driving circuit to scan forward and backward, and charges the pull-up control signal point and the pull-down control signal point by the input circuit, latches the superior level transmitted signal and the first inferior level transmitted signal by the latch circuit, finally drives the pixel unit by the scan driving signal generated by the signal multiplexing circuit to export to multiple scanning lines for driving the pixel unit, in order to simplify the circuit of the flat display device, spare space for a narrow bezel design of the flat display device.

Above are embodiments of the disclosure, which do not limit the scope of the disclosure, any modifications, equivalent replacements or improvements within the spirit and principles of the embodiments described above should be covered by the protected scope of the disclosure.

What is claimed is:

1. A scan driving circuit, wherein the scan driving circuit comprises a plurality of cascaded scan driving units, each of the scan driving units comprises:
 a forward/backward scanning circuit, applied to receive and process a superior level transmitted signal and a first inferior level transmitted signal, so as to control the scan driving circuit to scan forward and backward;

an input circuit, connected to the forward/backward scanning circuit, applied to receive the superior level transmitted signal and the first inferior level transmitted signal from the forward/backward scanning circuit, and to charge the a pull-up control signal point and a pull-down control signal point according to the superior level transmitted signal and the first inferior level transmitted signal;

a latch circuit, connected to the input circuit, applied to receive and latch the superior level transmitted signal and the first inferior level transmitted signal from the input circuit;

a reset circuit, connected to the input circuit and the latch circuit, applied to clear and reset electric potential of the pull-up control signal point; and a signal multiplexing circuit, connected to the latch circuit, applied to process a same level transmitted signal, a second inferior level transmitted signal and latch data received from the latch circuit, generating a scan driving signal that is exported to a scanning line for driving a pixel unit, wherein the forward/backward scanning circuit comprises a first, a second, a third and a fourth controllable switches, a control terminal of the first controllable switch receives the superior level transmitted signal and is connected to a control terminal of the fourth controllable switch, a first terminal of the first controllable switch is connected to a cut-in voltage terminal and a first terminal of the second controllable switch, a second terminal of the first controllable switch is connected to a second terminal of the second controllable switch, a first terminal of the third controllable switch and the input circuit, a control terminal of the second controllable switch receives the first inferior level transmitted signal and is connected to a control terminal of the third controllable switch, a second terminal of the third controllable switch is connected to a first terminal of the fourth controllable switch, a second terminal of the fourth controllable switch is connected to a cut-off voltage terminal;

wherein, the input circuit comprises a first inverter and a first clock control inverter, an input terminal of the first inverter receives a clock signal, an output terminal of the first inverter is connected to a first control terminal of the first clock control inverter, a second control terminal of the first clock control inverter receives the clock signal, an input terminal of the first clock control inverter is connected to the second terminal of the first controllable switch, an output terminal of the first clock control inverter is connected to the latch circuit and the reset circuit;

wherein the latch circuit comprises a second inverter, a third inverter and a second clock control inverter, an input terminal of the second clock control inverter is connected to the output terminal of the first clock control inverter and an input terminal of the third inverter, a first control terminal of the second clock control inverter receives the clock signal, an input terminal of the second inverter receives the clock signal, an output terminal of the second inverter is connected to a second control terminal of the second clock control inverter, an output terminal of the second clock control inverter is connected to an output terminal of the third inverter, the reset circuit and the signal multiplexing circuit;

wherein the reset circuit comprises a fifth controllable switch, a control terminal of the fifth controllable switch receives a reset signal, a first terminal of the fifth controllable switch is connected to the input terminal of the second clock control inverter and the input terminal of the third inverter, a second terminal of the fifth controllable switch is connected to the cut-in voltage terminal;

wherein the signal multiplexing circuit comprises a fourth, a fifth, a sixth, a seventh, an eighth, a ninth inverters, a first and a second NAND gates, a first input terminal of the first NAND gate receives a first driving signal, a second input terminal of the first NAND gate is connected to a first input terminal of the second NAND gate and the output terminal of the second clock control inverter, a second input terminal of the second NAND gate receives a second driving signal, an output terminal of the first NAND gate is connected to an input terminal of the fourth inverter, an output terminal of the fourth inverter is connected to an input terminal of the fifth inverter, an input terminal of the sixth inverter is connected to an output terminal of the fifth inverter and receives the same level transmitted signal, an output terminal of the sixth inverter is connected to a same level scanning line, an output terminal of the second NAND gate is connected to an input terminal of the seventh inverter, an output terminal of the seventh inverter is connected to an input terminal of the eighth inverter, an input terminal of the ninth inverter is connected to an output terminal of the eighth inverter and receives the second inferior level transmitted signal, an output terminal of the ninth inverter is connected to an inferior level scanning line.

2. The scan driving circuit according to claim 1, wherein the first and second controllable switches are P type MOS thin film transistors, the control terminals, the first terminals and the second terminals of the first and second controllable switches correspond to gate electrodes, drain electrodes and source electrodes of the P type MOS thin film transistors respectively; the third and fourth controllable switches are N type MOS thin film transistors, the control terminals, the first terminals and the second terminals of the third and fourth controllable switches correspond to gate electrodes, drain electrodes and source electrodes of the N type MOS thin film transistors respectively.

3. The scan driving circuit according to claim 1, wherein the fifth controllable switch is a P type MOS thin film transistor, the control terminal, the first terminal and the second terminal of the fifth controllable switch correspond to the gate electrode, the drain electrode and the source electrode of the P type MOS thin film transistor respectively.

4. A flat display device, wherein the flat display device comprises a scan driving circuit, the scan driving circuit comprises a plurality of cascaded scan driving units, each of the scan driving units comprises:

a forward/backward scanning circuit, applied to receive and process a superior level transmitted signal and a first inferior level transmitted signal, so as to control the scan driving circuit to scan forward and backward;

an input circuit, connected to the forward/backward scanning circuit, applied to receive the superior level transmitted signal and the first inferior level transmitted signal from the forward/backward scanning circuit, and to charge the a pull-up control signal point and a pull-down control signal point according to the superior level transmitted signal and the first inferior level transmitted signal;

a latch circuit, connected to the input circuit, applied to receive and latch the superior level transmitted signal and the first inferior level transmitted signal from the input circuit;
a reset circuit, connected to the input circuit and the latch circuit, applied to clear and reset electric potential of the pull-up control signal point; and
a signal multiplexing circuit, connected to the latch circuit, applied to process a same level transmitted signal, a second inferior level transmitted signal and latch data received from the latch circuit, generating a scan driving signal that is exported to a scanning line for driving a pixel unit,
wherein the forward/backward scanning circuit comprises a first, a second, a third and a fourth controllable switches, a control terminal of the first controllable switch receives the superior level transmitted signal and is connected to a control terminal of the fourth controllable switch, a first terminal of the first controllable switch is connected to a cut-in voltage terminal and a first terminal of the second controllable switch, a second terminal of the first controllable switch is connected to a second terminal of the second controllable switch, a first terminal of the third controllable switch and the input circuit, a control terminal of the second controllable switch receives the first inferior level transmitted signal and is connected to a control terminal of the third controllable switch, a second terminal of the third controllable switch is connected to a first terminal of the fourth controllable switch, a second terminal of the fourth controllable switch is connected to a cut-off voltage terminal;
wherein the input circuit comprises a first inverter and a first clock control inverter, an input terminal of the first inverter receives a clock signal, an output terminal of the first inverter is connected to a first control terminal of the first clock control inverter, a second control terminal of the first clock control inverter receives the clock signal, an input terminal of the first clock control inverter is connected to the second terminal of the first controllable switch, an output terminal of the first clock control inverter is connected to the latch circuit and the reset circuit;
wherein the latch circuit comprises a second inverter, a third inverter and a second clock control inverter, an input terminal of the second clock control inverter is connected to the output terminal of the first clock control inverter and an input terminal of the third inverter, a first control terminal of the second clock control inverter receives the clock signal, an input terminal of the second inverter receives the clock signal, an output terminal of the second inverter is connected to a second control terminal of the second clock control inverter, an output terminal of the second clock control inverter is connected to an output terminal of the third inverter, the reset circuit and the signal multiplexing circuit;

wherein the reset circuit comprises a fifth controllable switch, a control terminal of the fifth controllable switch receives a reset signal, a first terminal of the fifth controllable switch is connected to the input terminal of the second clock control inverter and the input terminal of the third inverter, a second terminal of the fifth controllable switch is connected to the cut-in voltage terminal;
wherein the signal multiplexing circuit comprises a fourth, a fifth, a sixth, a seventh, an eighth, a ninth inverters, a first and a second NAND gates, a first input terminal of the first NAND gate receives a first driving signal, a second input terminal of the first NAND gate is connected to a first input terminal of the second NAND gate and the output terminal of the second clock control inverter, a second input terminal of the second NAND gate receives a second driving signal, an output terminal of the first NAND gate is connected to an input terminal of the fourth inverter, an output terminal of the fourth inverter is connected to an input terminal of the fifth inverter, an input terminal of the sixth inverter is connected to an output terminal of the fifth inverter and receives the same level transmitted signal, an output terminal of the sixth inverter is connected to a same level scanning line, an output terminal of the second NAND gate is connected to an input terminal of the seventh inverter, an output terminal of the seventh inverter is connected to an input terminal of the eighth inverter, an input terminal of the ninth inverter is connected to an output terminal of the eighth inverter and receives the second inferior level transmitted signal, an output terminal of the ninth inverter is connected to an inferior level scanning line.

5. The flat display device according to claim 4, wherein the first and second controllable switches are P type MOS thin film transistors, the control terminals, the first terminals and the second terminals of the first and second controllable switches correspond to gate electrodes, drain electrodes and source electrodes of the P type MOS thin film transistors respectively; the third and fourth controllable switches are N type MOS thin film transistors, the control terminals, the first terminals and the second terminals of the third and fourth controllable switches correspond to gate electrodes, drain electrodes and source electrodes of the N type MOS thin film transistors respectively.

6. The flat display device according to claim 4, wherein the fifth controllable switch is a P type MOS thin film transistor, the control terminal, the first terminal and the second terminal of the fifth controllable switch correspond to the gate electrode, the drain electrode and the source electrode of the P type MOS thin film transistors respectively.

7. The flat display device according to claim 4, wherein the flat display device is a LCD or an OLED.

* * * * *